(12) United States Patent
Murakami et al.

(10) Patent No.: US 11,967,659 B2
(45) Date of Patent: Apr. 23, 2024

(54) SEMICONDUCTOR WAFER, RADIATION DETECTION ELEMENT, RADIATION DETECTOR, AND PRODUCTION METHOD FOR COMPOUND SEMICONDUCTOR MONOCRYSTALLINE SUBSTRATE

(71) Applicant: JX METALS CORPORATION, Tokyo (JP)

(72) Inventors: Koji Murakami, Kitaibaraki (JP); Akira Noda, Kitaibaraki (JP); Ryuichi Hirano, Tokyo (JP)

(73) Assignee: JX METALS CORPORATION, Tokyo (JP)

( * ) Notice: Subject to any disclaimer, the term of this patent is extended or adjusted under 35 U.S.C. 154(b) by 348 days.

(21) Appl. No.: 17/439,207

(22) PCT Filed: Dec. 5, 2019

(86) PCT No.: PCT/JP2019/047671
§ 371 (c)(1),
(2) Date: Sep. 14, 2021

(87) PCT Pub. No.: WO2020/235123
PCT Pub. Date: Nov. 26, 2020

(65) Prior Publication Data
US 2022/0199841 A1 Jun. 23, 2022

(30) Foreign Application Priority Data
May 17, 2019 (JP) ................. 2019-094049

(51) Int. Cl.
*H01L 31/0296* (2006.01)
*H01L 27/146* (2006.01)
(Continued)

(52) U.S. Cl.
CPC .. *H01L 31/02966* (2013.01); *H01L 27/14658* (2013.01); *H01L 31/085* (2013.01); *H01L 31/1832* (2013.01); *C30B 29/48* (2013.01)

(58) Field of Classification Search
CPC ............. H01L 31/02966; H01L 31/085; H01L 31/1832; H01L 27/14658; C30B 29/48
See application file for complete search history.

(56) References Cited

U.S. PATENT DOCUMENTS

| | | | |
|---|---|---|---|
| 2004/0155310 A1* | 8/2004 | Hirano | G02F 1/0018 257/E31.017 |
| 2008/0060729 A1 | 3/2008 | Pelliciari | |

(Continued)

FOREIGN PATENT DOCUMENTS

| | | |
|---|---|---|
| JP | 63-185898 A | 8/1988 |
| JP | 5-155699 A | 6/1993 |

(Continued)

OTHER PUBLICATIONS

International Preliminary Report on Patentability and Written Opinion for PCT/JP2019/047671 dated Dec. 2, 2021.
(Continued)

Primary Examiner — David Vu
Assistant Examiner — Brandon C Fox
(74) Attorney, Agent, or Firm — Birch, Stewart, Kolasch & Birch, LLP

(57) ABSTRACT

Provided is a stable CdZnTe monocrystalline substrate having a small leakage current even when a high voltage is applied and having a lower variation in resistivity with respect to variations in applied voltage values. A semiconductor wafer comprising a cadmium zinc telluride monocrystal having a zinc concentration of 4.0 at % or more and 6.5 at % or less and a chlorine concentration of 0.1 ppm by mass or more and 5.0 ppm by mass or less, wherein the semiconductor wafer has a resistivity of $1.0 \times 10^7$ Ωcm or more and $1.0 \times 10^8$ Ωcm or less when a voltage of 900 V is applied, and wherein a ratio (variation ratio) of the resistivity at application of 0 V to the resistivity at application of a voltage of 900 V is 20% or less.

5 Claims, 2 Drawing Sheets

(51) Int. Cl.
*H01L 31/08* (2006.01)
*H01L 31/18* (2006.01)
*C30B 29/48* (2006.01)

(56) References Cited

U.S. PATENT DOCUMENTS

2011/0186788 A1  8/2011  Hackenschmied et al.
2014/0284489 A1  9/2014  Engel et al.

FOREIGN PATENT DOCUMENTS

| | | |
|---|---|---|
| JP | 9-124310 A | 5/1997 |
| JP | 2004-238268 A | 8/2004 |
| JP | 2008-100900 A | 5/2008 |
| JP | 2013-241289 A | 12/2013 |
| JP | 2015-504513 A | 2/2015 |
| JP | 2016-18972 A | 2/2016 |
| JP | 6018532 B2 | 11/2016 |
| JP | 2017-197413 A | 11/2017 |

OTHER PUBLICATIONS

International Search Report for PCT/JP2019/047671 dated Mar. 3, 2020.

\* cited by examiner

SEMICONDUCTOR WAFER, RADIATION DETECTION ELEMENT, RADIATION DETECTOR, AND PRODUCTION METHOD FOR COMPOUND SEMICONDUCTOR MONOCRYSTALLINE SUBSTRATE

FIELD OF THE INVENTION

The present invention relates to a semiconductor wafer, a radiation detection element, a radiation detector, and method for producing a compound semiconductor monocrystalline substrate.

BACKGROUND OF THE INVENTION

Conventionally, various compound semiconductors that form substrates for radiation detection elements have been developed. Among those, cadmium zinc telluride (CdZnTe) is attracting attention as a promising material because of technological innovation in crystal development in recent years.

Since CdZnTe is composed of elements having relatively large atomic numbers, it has a higher detection efficiency of radiation (hard X-rays and γ-rays). Therefore, a radiation detector using the CdZnTe (hereinafter referred to as CdZnTe-based detector) can be made smaller and have higher performance than those using other compound semiconductors.

Further, since the CdZnTe-based detector has a mechanism for directly converting radiation into an electric current, it has higher detection efficiency and energy resolution than those of a scintillator detector having an indirect operation mechanism via luminescence, represented by sodium iodide (NaI).

Furthermore, since CdZnTe has a larger band gap, it is not susceptible to heat and has a smaller leakage current during operation. Therefore, the CdZnTe-based detector can operate at room temperature, and the devise size can be decreased, and further an increased energy resolution can be exerted by applying a high bias current, as compared with a detector using silicon (Si) or germanium (Ge) which requires a cooling device to operate it (see Patent Literatures 1 and 2).

CITATION LIST

Patent Literatures

[Patent Literature 1] U.S. Patent Application Publication No. 2011/0186788 A1
[Patent Literature 2] Japanese Patent Application Publication No. S63-185898 A
[Patent Literature 3] Japanese Patent Application Publication No. 2004-238268 A
[Patent Literature 4] Japanese Patent Application Publication No. 2013-241289 A
[Patent Literature 5] Japanese Patent No. 6018532 B
[Patent Literature 6] Japanese Patent Application Publication No. 2008-100900 A
[Patent Literature 7] Japanese Patent Application Publication No. H05-155699 A
[Patent Literature 8] Japanese Patent Application Publication No. H09-124310 A
[Patent Literature 9] Japanese Patent Application Publication No. 2017-197413 A

SUMMARY OF THE INVENTION

Technical Problem

There are prior arts such as Patent Literatures 3 to 9 for increased resistivity of CdTe-based monocrystals. Patent Literature 3 discloses a technique for providing a CdTe monocrystal having $10^8$ to $10^9$ Ωcm by doping with chlorine (Cl) or indium (In). Patent literature 4 discloses a technique in which a resistivity value in the $10^{11}$ Ωcm order can be achieved by subjecting an In-doped CdZnTe monocrystal at application of a bias voltage of 100 V to a two-step ingot annealing after monocrystal growth. However, these do not recognize a problem in terms of resistivity at application of a high bias voltage, such as a case where the monocrystal is used as a radiation detector in a low dose environment, and they do not mention whether or not, even in such a situation, a sufficient resistivity value is achieved. Patent Literature 5 discloses a CdTe or CdZnTe substrate cut out from an ingot obtained by subjecting a CdZnTe monocrystal doped with In as in Patent Literature 4 to monocrystal growth, followed by ingot annealing while maintaining a Cd vapor pressure, wherein when a bias voltage of 0V, 700V and 900V is applied to the substrate, a resistivity is in the $10^7$ Ωcm order, and a relative standard deviation of the resistivity in a substrate plane at 0 V is 20% or less.

In contrast to Patent Literatures 4 and 5, Patent Literatures 6 to 8 disclose a technique (wafer annealing) in which a substrate is cut out from a CdTe monocrystalline ingot and annealed for the substrate. Among them, Patent Literature 6 performs annealing at an elevated temperature close to a melting point of CdTe in an Ar atmosphere, thereby removing precipitates. Patent Literature 7 subjects a CdTe substrate to wafer annealing at two stages: a high-temperature annealing at about 700° C. and annealing at about 400° C. in vacuum. Patent Literature 8 subjects a CdTe substrate to two-stage low-temperature annealing at about 400° C. in vacuum. Patent Literature 9 discloses that an In-doped CdZnTe substrate is subjected to wafer annealing at about 300° C. in an inert gas atmosphere, and when a bias of 700 V is applied to the annealed CdZnTe, a resistivity is in the $10^{11}$ Ωcm order. However, none of these literatures discloses that, according to these wafer annealing techniques, a substrate having a resistivity of $10^7$ Ωcm or more is obtained when a high voltage of 900 V is applied.

By the way, it is desired that the CdZnTe-based detector has a sufficiently high resistivity when a high bias voltage is applied for the purpose of suppressing a leakage current even when a high bias voltage is applied. The prior art, for example, Patent Literature 5 discloses that the resistivity of the CdZnTe substrate is in the $10^7$ Ωcm order when bias voltages of 0 V, 700 V and 900 V are applied to the substrate, by subjecting the In-doped CdZnTe monocrystal to monocrystal growth, followed by ingot annealing while maintaining the Cd vapor pressure, as described above. Here, the present inventors have found that when a high bias voltage is applied to the CdZnTe substrate, a value of a leakage current generated in the CdZnTe substrate tends to increase, and the resistivity may significantly vary due to a change in the value of the leak current with respect to the applied voltage. For the CdZnTe substrate disclosed in Patent Literature 5, a ratio (variation ratio) of the resistivity at application of 0 V to the resistivity at application of a voltage of 900 V (resistivity at 0 V/resistivity at 900 V) is calculated as approximately 350 to 800, which causes a problem that the resistivity significantly varies when a high voltage of 900 V is applied from a state where no voltage is applied.

Therefore, an object of the present invention is to provide a stable CdZnTe monocrystalline substrate having a small leakage current even when a high voltage is applied and having a lower variation in resistivity with respect to variations in the applied voltage values. Another object of the present invention is to provide a method that can effectively produce the above CdTe-based monocrystalline substrate.

Solution to Problem

As a result of intensive studies in order to solve the above technical problems, the present inventors have found that a substrate which has a sufficiently high resistivity even when a high bias voltage is applied from a state where no voltage is applied, and which can reduce its variation range can be obtained by considering a chemical composition, dopant materials to be added, and annealing conditions involved in a carrier activation in a crystal for a compound monocrystal based on CdZnTe. Then, they have found that when it is formed into an element, a radiation detection element having stable performance can be produced, and have completed the present invention.

In an embodiment, the present invention relates to a semiconductor wafer comprising a cadmium zinc telluride monocrystal having a zinc concentration of 4.0 at % or more and 6.5 at % or less and a chlorine concentration of 0.1 ppm by mass or more and 5.0 ppm by mass or less, wherein the semiconductor wafer has a resistivity of $1.0 \times 10^7$ Ωcm or more and $1.0 \times 10^8$ Ωcm or less when a voltage of 900 V is applied, and wherein a ratio (variation ratio) of the resistivity at application of 0 V to the resistivity at application of a voltage of 900 V is 20% or less. As used herein, the resistivity means a value determined by investigating a IV characteristic by gradually applying a voltage to an element structure of the CdZnTe monocrystalline substrate in which an electrode structure is formed, drawing a IV characteristic curve, and, from the IV characteristic curve, obtaining a resistivity when a micro-voltage (about 0.1 V) is applied as 0 V resistivity (hereinafter referred to as 0V resistivity) and a resistivity when 900 V is applied as 900 V resistivity.

In another embodiment, the present invention relates to a radiation detection element, comprising: a substrate cut out from the semiconductor wafer according to the embodiment of the present invention such that a main surface is rectangular; a common electrode formed on one main surface of the substrate; and a plurality of pixel electrodes formed in matrix on the other main surface of the substrate.

In another embodiment, the radiation detection element of the present invention has a resistivity of $1.0 \times 10^7$ Ωcm or more and $1.0 \times 10^8$ Ωcm or less when a voltage of 900 V is applied, and wherein a ratio (variation ratio) of the resistivity at application of 0 V to the resistivity at application of a voltage of 900 V is 20% or less.

In yet another embodiment, the present invention relates to a radiation detector, comprising: the radiation detection element according to the embodiment of the present invention; a power source for applying a bias voltage to the radiation detection element, the power source being connected to the radiation detection element; and an amplification unit for amplifying an electric signal output from the radiation detection element, the amplification unit being connected to the radiation detection element.

In yet another embodiment, the present invention relates to a method for producing a compound semiconductor monocrystalline substrate, the substrate comprising a cadmium zinc telluride monocrystal having a zinc concentration of 4.0 at % or more and 6.5 at % or less and a chlorine concentration of 0.1 ppm by mass or more and 5.0 ppm by mass or less, the substrate having a resistivity of $1.0 \times 10^7$ Ωcm or more and $1.0 \times 10^8$ Ωcm or less when a voltage of 900 V is applied, wherein the method comprises:

a crystal growth step of a monocrystal in a furnace; and after the crystal growth step of the monocrystal is completed, a step of subjecting the monocrystal to a heat treatment for 50 to 90 hours under conditions where a temperature of a monocrystal placing position in the furnace is 385 to 400° C. and a temperature of a Cd reservoir portion is room temperature without opening an ampule in the furnace, and slicing a heated monocrystal ingot into a wafer to form a substrate.

Advantageous Effects of Invention

According to the embodiment of the present invention, it is possible to obtain a semiconductor wafer having a high resistivity of $1.0 \times 10^7$ Ωcm or more and $1.0 \times 10^8$ Ωcm or less when a voltage of 900 V is applied, and a low ratio (variation ratio) of the resistivity at application of 0 V to the resistivity at application of a voltage of 900 V (resistivity at 0 V/resistivity at 900 V) of 20% or less, by both the action of a part (Zn and Cl) of the raw materials having doped amounts adjusted such that the concentrations are in a predetermined range in the monocrystal, and the heat treatment for 50 to 90 hours after the crystal growth step of the monocrystal, which is carried out under conditions where the temperature of the monocrystal placing position in the furnace is 385 to 400° C., and the temperature of the Cd reservoir is room temperature in a series of steps, without opening the ampule in the furnace. Therefore, the use of a radiation detection element provided with a substrate cut out from that wafer can allow generation of a large amount of leakage current to be suppressed even if a high bias voltage is applied, resulting in stable element characteristics for changes in the applied voltage.

Therefore, it is possible to improve radiation detection performance for the radiation detector provided with the radiation detection element using the CdZnTe monocrystal as the substrate.

DETAILED DESCRIPTION OF THE INVENTION

[Structures of Radiation Detector and Radiation Detection Element]

First, schematic structures of a radiation detector and a radiation detection element according to the present embodiment will be described.

Figure 1:
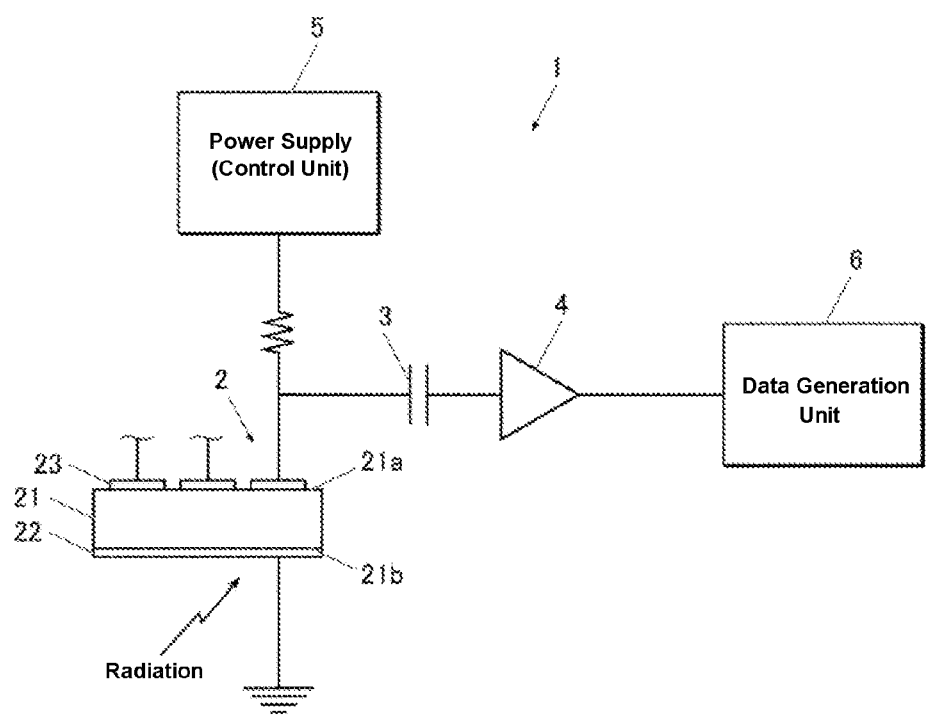
FIG. 1 is an arrangement view of a radiation detector according to an embodiment of the present invention.

As shown in FIG. 1, a radiation detector 1 according to the present embodiment includes: a radiation detection element 2; a capacitor 3; an amplification unit 4; and the like.

A substrate 21 forming the radiation detection element 2 is a cadmium zinc telluride (CdZnTe) monocrystal, which is a II-VI group compound semiconductor monocrystal, and a main surface of the substrate 21 is formed in a thin plate shape. Further, the main surface of the substrate 21 is parallel to a predetermined crystal plane (for example, a (111) plane).

A common electrode 22 is a thin film of a metal (for example, platinum (Pt)) and is formed so as to cover the entire one main surface (hereinafter, B surface 21b) of the substrate 21. A plurality of pixel electrodes 23 are thin metal films and provided on the other main surface of the substrate 21 (hereinafter referred to as A surface 21a), and are arranged in the form of matrix. Hereinafter, when the common electrode 22 and the pixel electrodes 23 are not distinguished, both electrodes are collectively referred to as electrodes 22, 23.

The radiation detection element 2 is configured such that a predetermined bias voltage is applied, by connecting the common electrode 22 to the ground (grounding) and connecting each pixel electrode 23 to a power supply (a control unit) 5. Further, each pixel electrode 23 is connected to the capacitor 3 and the amplification unit 4. Although FIG. 1 shows that only the rightmost pixel electrode is connected to the capacitor 3 and the amplification unit 4, the other pixel electrodes 23 are also connected to the capacitor 3 and the amplification unit 4.

According to such a configuration, when the radiation detection element 2 receives radiation (hard X-rays or γ-rays), the radiation detector 1 generates electron-hole pairs in the substrate 21, which are output from the pixel electrodes 23 as an ionizing current by the bias voltage applied to the radiation detection element 2. This ionization current is then converted into an electric signal via the capacitor 3 and the amplification unit 4, and output to a data generation unit 6.

[Structure of Monocrystal Growth Furnace]

Next, a structure of a monocrystal growth furnace 9 for producing the Cd(Zn)Te monocrystal forming the substrate 21 will be described.

Figure 2:
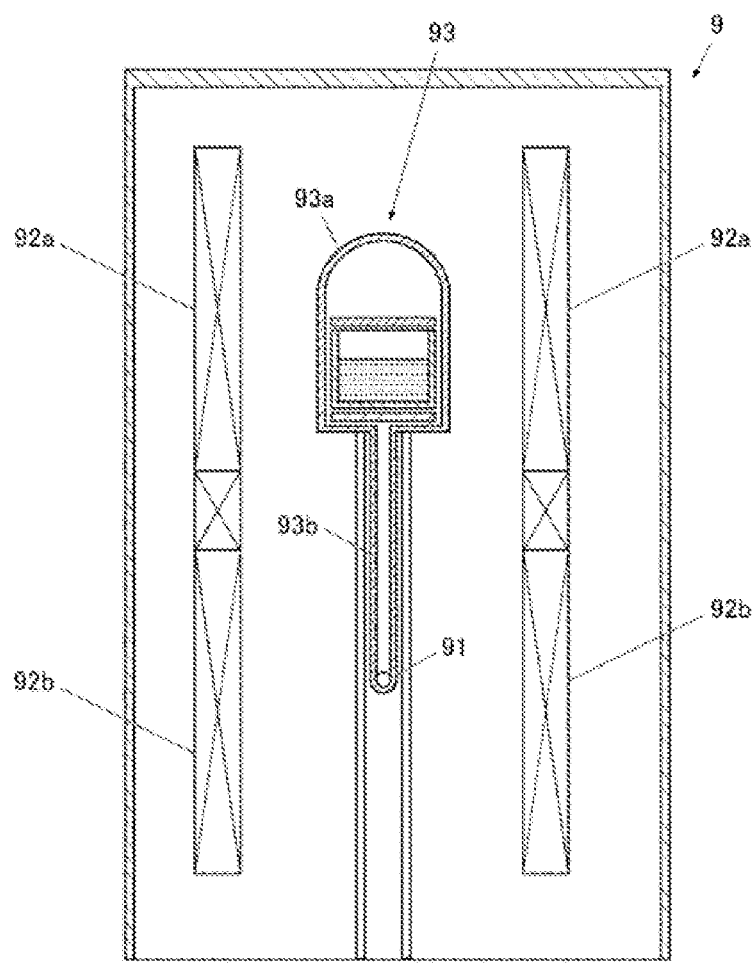
FIG. 2 is a vertical cross-sectional view of a monocrystal growth furnace for producing a compound semiconductor monocrystal which will be a substrate of the radiation detection element in FIG. 1.

The monocrystal growth furnace 9 according to the present embodiment is used in a vertical gradient freezing (VGF) method, and as shown in FIG. 2, it includes: an outer monocrystal growth furnace body; a cadmium filling portion 91 for applying steam pressure; heaters 92; a quartz ampoule 93; and the like.

The heaters 92a, 92b are arranged in column inside the body, and each is configured to have a plurality of stages of heat generating portions. Each of the heaters 92a, 92b can independently set a heating temperature.

The quartz ampoule 93 is comprised of a cylindrical crucible storage portion 93a and a tubular Cd reservoir portion 93b for controlling cadmium vapor pressure, which extends downward from a lower portion of the crucible storage portion 93a. The quartz ampoule 93 is arranged in the furnace body so that the crucible storage portion 93a is surrounded by the upper heater 92a and the Cd reservoir portion 93b is surrounded by the lower heater 92b.

[Method for Producing Compound Semiconductor Monocrystal and Semiconductor Wafer]

Next, a method for producing a Cd(Zn)Te monocrystal which is a compound semiconductor monocrystal according to the present embodiment, using the above monocrystal growth furnace 9, and a method for producing a Cd(Zn)Te wafer which is a semiconductor wafer according to the present invention, from the Cd(Zn)Te monocrystal, are described.

The method for producing the Cd(Zn)Te monocrystal according to the present embodiment includes: a preparation step; a crystal growth step; and a heat treatment step, and the method for producing the Cd(Zn)Te wafer includes: a cutting step; a wrapping step; and a mirror polishing step.

In the first preparation step, first, the crucible is filled with a predetermined amount of Cd having a purity of 6N (99.99999%), Te having 6N, Zn and Cl which is a dopant material (impurity) as raw materials. Each of Zn and Cl is added by adjusting the amount such that the Zn concentration in the monocrystal is 4.0 at % or more and 6.5 at % or less, and the Cl concentration is 0.1 ppm by mass or more and 5.0 ppm by mass or less.

Then, Cd is placed in the Cd reservoir portion 93b of the quartz ampoule 93, and the crucible filled with the raw materials is placed in the quartz ampoule 93. The quartz ampoule is then sealed in vacuum and the interior of the furnace is heated by the heaters 92a, 92b to synthesize the raw materials contained in the crucible. After that, the interior of the furnace is further heated to melt the raw materials into a melt and the dopant is diffused into the melt. At this time, a vapor pressure of Cd is adjusted to about 0.12 to 0.14 MPa by controlling the temperature of the lower heater 92b, thereby suppressing the evaporation of Cd from the melt.

After the raw materials in the crucible becomes the melt and stabilizes, the step proceeds to the crystal growth step. In the crystal growth step, the output of each heat generating portion of the upper heater 92a, which is composed of a plurality of stages in column, is adjusted so that a temperature gradient is generated so as to decrease the temperature from the lower end to the upper end of the melt. The output of each heater is adjusted such that, at the upper portion of the melt, the temperature gradient is 0.05 to 1.0° C./cm, and at the lower portion of the melt, the temperature gradient is about 1.0 to 5.0° C./cm, which is higher than that of the upper portion in order to prevent the melt from instantaneously solidifying the raw material melt in the crucible in a temperature decreasing step during the growth of the monocrystal.

Then, when the temperature in the furnace is gradually decreased while maintaining the temperature gradient in the melt, the monocrystal is formed on the surface of the melt where the temperature is the lowest, and the monocrystal grows downward.

After the monocrystal is grown to a predetermined length, the step proceeds to the heat treatment step. In the heat treatment step, first, the temperature inside the furnace is decreased from the temperature at the end of the growth of the monocrystal to 385° C. to 400° C. by adjusting the temperature of each heat generation portion composed of a plurality of stages of the upper heater 92a while maintaining the grown CdZnTe monocrystal in the quartz ampule, and while maintaining the vapor pressure of Cd at a predetermined pressure by controlling the temperature of the lower heater 92b. Subsequently, in that state, the CdZnTe monocrystal is subjected to a heat treatment (ingot annealing) for 50 to 90 hours under conditions where the temperature of the Cd reservoir portion 93b is room temperature, without opening the ampoule (quartz ampoule 93) in the furnace. Here, for the heat treatment of Patent Literature 9, after growth of the monocrystal, the sliced wafer-shaped substrate is subjected to the heat treatment (wafer annealing) at 275 to 325° C. for 10 to 25 hours in an inert atmosphere, and an electrode is formed on the CdZnTe monocrystal substrate after the wafer annealing to achieve a high resistivity of $1 \times 10^{11}$ Ωcm or more when a voltage of 900 V is applied. However, according to the embodiment of the present invention, the variation in the resistivity is lower with respect to the variations in the applied voltages, and the stable resistivity can be maintained for the variations in the applied voltages, and, in particular, even if a higher voltage of 900V is applied, the variation ratio of the resistivities is lower, and when used for a radiation detection element, the variation in the resistivity during high-bias operation for detecting a small amount of radiation is lower and the generation of noise due to leakage current can be suppressed.

After subjecting the monocrystal to the heat treatment, the step proceeds to the cutting step. In the cutting step, the CdZnTe monocrystal ingot is sliced into a wafer shape along a predetermined crystal plane, and a plurality of wafers are cut out.

After cutting out the wafers, the step proceeds to the wrapping step. In the wrapping step, the cut surface of each cut wafer is polished with a wrapping abrasive to remove irregularities.

After flattening the cut surface, the step proceeds to the mirror polishing step. In the mirror polishing step, the polished surface of each wafer is polished with an abrasive for mirror polishing to finish it as a mirror surface.

By undergoing the above steps, the CdZnTe wafer according to the present embodiment is produced. The CdZnTe wafer is composed of a cadmium zinc telluride monocrystal having a zinc concentration of 4.0 at % or more and 6.5 at % or less and a chlorine concentration of 0.1 ppm by mass or more and 5.0 ppm by mass or less.

The CdZnTe wafer has a high resistivity of $1.0 \times 10^7$ Ωcm or more and $1.0 \times 10^8$ Ωcm or less when a voltage of 900 V is applied, and a lower ratio (variation ratio) of the resistivity at application of 0 V to the resistivity at application of a voltage of 900 V (resistivity at 0 V/resistivity at 900 V) of 20% or less.

[Method for Producing Radiation Detection Element]

Next, a method for producing the radiation detection element 2 using the CdZnTe wafer as a substrate will be described. The radiation detection element 2 according to the present embodiment is produced through an electrode forming step, a dicing step, and an element resistivity measuring step.

In the first electrode forming step, first, the above CdZnTe wafer is washed to remove foreign substances adhering to the surface. A photoresist is then applied to the polished surface of the CdZnTe wafer, and the photoresist is exposed using a photomask on which pixel electrode patterns is drawn. The development is then carried out to remove the exposed photoresist. The CdZnTe wafer is then immersed in a plating solution, and a metal is deposited onto positions where the photoresist has been removed, of the polished surfaces 21a, 21b of the CdZnTe wafer to form thin film layers. These thin film layers are grown to a predetermined film thickness to form the electrodes 22, 23. After the electrodes 22, 23 are formed, any unnecessary photoresist is removed, and the CdZnTe wafer is washed and dried.

After forming the electrodes 22, 23, the step proceeds to the dicing step. In the dicing step, the CdZnTe wafer in which the electrodes 22, 23 are formed on the polished surfaces 21a, 21b is cut and divided into a plurality of substrates 21, and the individual radiation detection elements 2 are cut out from the CdZnTe wafers.

In the element resistivity measuring step, a sample for evaluation is obtained from the cut-out elements, and a voltage is applied to the sample to measure the element resistivity.

By undergoing each of the above steps, a plurality of radiation detection elements 2 according to the present embodiment are produced.

As described above, the CdZnTe wafer can have a resistivity of $1.0 \times 10^7$ Ωcm or more and $1.0 \times 10^8$ Ωcm or less when a voltage of 900 V is applied, and a lower ratio (variation ratio) of the resistivity at application of 0 V to the resistivity at application of a voltage of 900 V (resistivity at 0 V/resistivity at 900 V) of 20% or less, so that the detection performance of the radiation detection element 2 is improved.

EXAMPLES

Hereinafter, Examples are provided for better understanding of the present invention and its advantages, but the present invention is not limited to these Examples.
[Comparison of Present Invention with Prior Art]

Next, a difference between characteristics of the substrate and the radiation detection element 2 according to the present embodiment and the substrate and the radiation detection element according to Comparative Example will be described.

For the description, first, six CdZnTe monocrystal ingots (Examples 1 to 3 and Comparative Examples 1 to 3) were produced by the above method for producing the monocrystal, and ingot annealing under the conditions of Examples 1 to 3 was carried out, and ingot annealing under the conditions of Comparative Examples 1 to 3 was carried out, and the CdZnTe monocrystals after the ingot annealing were taken out from the interior of the quartz ampule. Each ingot was then cut along the (111) plane to cut out a disk-shaped wafer, and a square substrate is further cut out from each wafer, and to produce an electrode on each substrate, a common electrode was formed from Pt on one main surface (B surface), and pixel electrodes were formed from Pt on the other main surface (A surface), and each substrate was diced to produce an ohmic type radiation detection element. Subsequently, the IV characteristic of each element was investigated by gradually applying a voltage to each element, and the IV characteristic curve was drawn. Subsequently, from the IV characteristic curve, the resistivity when a microvoltage (about 0.1V) was applied (hereinafter referred to as 0V resistivity) and the resistivity when voltages of 100V, 250V, 500V, 700V, 900V were applied were calculated. Table 1 summarizes the production conditions of each ingot, the characteristics of the wafer obtained from each ingot, the characteristics of the substrate cut out from each wafer and of the radiation detection element produced from each substrate. Specifically, the measurement of the resistivity of each substrate was carried out by using a measuring device called COREMA-WT (contactless voltage mapping) from SEMIMAP SCIENTIFIC INSTRUMENTS, dividing the substrate into a plurality of fine parts (pixels) arranged in matrix along the main surface, measuring the resistivity for each part (hereinafter, referred to as a local resistivity), and obtaining an average value of the local resistivities (hereinafter, referred to as a resistivity of a substrate), thereby obtaining a resistivity at each applied voltage.

Example 1

In Example 1, a CdZnTe monocrystal ingot was grown from a CdZnTe melt having a Zn concentration of 5 at % and a Cl concentration of 100 wtppm by the VGF method. At the end of monocrystal growth, for the temperature inside the furnace, the temperature of the monocrystal placing position was set to 385° C. from the end temperature of the monocrystal growth, and the temperature of the Cd reservoir portion was set to room temperature without opening the quartz ampule in the furnace, and the ingot annealing was carried out for 90 hours. After the ingot annealing, the ingot was cooled to room temperature to produce a CdZnTe monocrystal ingot. Subsequently, a substrate having a square main surface of 4.0 mm×4.0 mm and a thickness of 1.4 mm was cut out from the upper portion of the ingot according to Example 1 (solidification rate of 0.19). The composition of this substrate was examined, indicating that as shown in Table 1, the Zn ratio was 6.1 at % and the Cl concentration was 1.2 wtppm, which were within the range of the present invention.

Subsequently, from the substrate according to Example 1, a common electrode was formed from Pt on one main surface (B surface) and pixel electrodes were formed from Pt on the other main surface (A surface) to produce an ohmic type radiation detection element. The IV characteristic curve of the radiation detection element was drawn and calculated, indicating that the resistivity at application of 0 V was $2.9 \times 10^8$ Ωcm, and the resistivity at application of 900 V was $2.0 \times 10^7$ Ωcm. The variation rate (resistivity at 0V/resistivity at 900V) was 14.8%.

Example 2

In Example 2, a CdZnTe monocrystal ingot was grown from a CdZnTe melt having a Zn concentration of 5 at % and a Cl concentration of 100 wtppm. At the end of monocrystal growth, for the temperature inside the furnace, the temperature of the monocrystal placing position was set to 390° C. from the end temperature of the monocrystal growth, and the temperature of the Cd reservoir portion was set to room temperature without opening the quartz ampule in the furnace, and the ingot annealing was carried out for 90 hours. After the ingot annealing, the ingot was cooled to room temperature to produce a CdZnTe monocrystal ingot. Subsequently, a substrate having a square main surface of 4.0 mm×4.0 mm and a thickness of 1.4 mm was cut out from the upper portion of the ingot according to Example 2 (solidification rate of 0.75). The composition of this substrate was examined, indicating that as shown in Table 1, the Zn ratio was 4.3 at % and the Cl concentration was 3.9 wtppm, which were within the range of the present invention.

Subsequently, from the substrate according to Example 2, a common electrode was formed from Pt on one main surface (B surface) and pixel electrodes were formed from Pt on the other main surface (A surface) to produce an ohmic type radiation detection element. The IV characteristic curve of the radiation detection element was drawn and calculated, indicating that the resistivity at application of 0 V was $6.4 \times 10^8$ Ωcm, and the resistivity at application of 900 V was $5.5 \times 10^7$ Ωcm. The variation rate (resistivity at 0V/resistivity at 900V) was 11.6%.

Example 3

In Example 3, a CdZnTe monocrystal ingot was grown from a CdZnTe melt having a Zn concentration of 5 at % and a Cl concentration of 200 wtppm. At the end of monocrystal growth, for the temperature inside the furnace, the temperature of the monocrystal placing position was set to 400° C. from the end temperature of the monocrystal growth, and the temperature of the Cd reservoir portion was set to room temperature without opening the quartz ampule in the furnace, and the ingot annealing was carried out for 50 hours. After the ingot annealing, the ingot was cooled to room temperature to produce a CdZnTe monocrystal ingot. Subsequently, a substrate having a square main surface of 4.0 mm×4.0 mm and a thickness of 1.4 mm was cut out from the upper portion of the ingot according to Example 3 (solidification rate of 0.20). The composition of this substrate was examined, indicating that as shown in Table 1, the Zn ratio was 6.1 at % and the Cl concentration was 2.5 wtppm, which were within the range of the present invention.

Subsequently, from the substrate according to Example 3, a common electrode was formed from Pt on one main surface (B surface) and pixel electrodes were formed from Pt on the other main surface (A surface) to produce an ohmic type radiation detection element. The IV characteristic curve of the radiation detection element was drawn and calculated, indicating that the resistivity at application of 0 V was $5.8 \times 10^8$ Ωcm, and the resistivity at application of 900 V was $3.9 \times 10^7$ Ωcm. The variation rate (resistivity at 0V/resistivity at 900V) was 15.0%.

Comparative Example 1

In Comparative Example 1, a CdZnTe monocrystal ingot was grown from a CdZnTe melt having a Zn concentration of 5 at % and a Cl concentration of 100 wtppm. At the end of monocrystal growth, for the temperature inside the furnace, the temperature of the monocrystal placing position was set to 950° C. from the end temperature of the monocrystal growth, and the temperature of the Cd reservoir was set to room temperature without opening the quartz ampule in the furnace, and the ingot annealing was carried out for 20 hours. After the ingot annealing, the ingot was cooled to room temperature to produce a CdZnTe monocrystal ingot. Subsequently, a substrate having a square main surface of 4.0 mm×4.0 mm and a thickness of 1.4 mm was cut out from the upper portion of the ingot according to Comparative Example 1 (solidification rate of 0.22). The composition of this substrate was examined, indicating that as shown in Table 1, the Zn ratio was 6.0 at % and the Cl concentration was 1.3 wtppm, which were within the range of the present invention.

Subsequently, from the substrate according to Comparative Example 1, a common electrode was formed from Pt on one main surface (B surface) and pixel electrodes were formed from Pt on the other main surface (A surface) to produce an ohmic type radiation detection element. The IV characteristic curve of the radiation detection element was drawn and calculated, indicating that the resistivity at application of 0 V was $1.1 \times 10^9$ Ωcm, and the resistivity at application of 900 V was significantly decreased to $3.5 \times 10^5$ Ωcm. The variation rate (resistivity at 0V/resistivity at 900V) was about 3168%.

In Comparative Example 1, the annealing temperature of the ingot annealing was higher, i.e., 950° C., and the produced CdZnTe monocrystalline substrate had a higher variation ratio of the resistivity at application of 900 V.

Comparative Example 2

In Comparative Example 2, a CdZnTe monocrystal ingot was grown from a CdZnTe melt having a Zn concentration of 5 at % and a Cl concentration of 100 wtppm. At the end of monocrystal growth, for the temperature inside the furnace, the temperature of the monocrystal placing position was set to 410° C. from the end temperature of the monocrystal growth, and the temperature of the Cd reservoir portion was set to room temperature without opening the quartz ampule in the furnace, and the ingot annealing was carried out for 90 hours. After the ingot annealing, the ingot was cooled to room temperature to produce a CdZnTe monocrystal ingot. Subsequently, a substrate having a square main surface of 4.0 mm×4.0 mm and a thickness of 1.4 mm was cut out from the upper portion of the ingot according to Comparative Example 2 (solidification rate of 0.17). The composition of this substrate was examined, indicating that as shown in Table 1, the Zn ratio was 6.1 at % and the Cl concentration was 1.2 wtppm, which were within the range of the present invention.

Subsequently, from the substrate according to Comparative Example 2, a common electrode was formed from Pt on one main surface (B surface) and pixel electrodes were formed from Pt on the other main surface (A surface) to produce an ohmic type radiation detection element. The IV characteristic curve of the radiation detection element was drawn and calculated, indicating that the resistivity at application of 0 V was $5.7×10^8$ Ωcm, and the resistivity at application of 900 V was $2.3×10^7$ Ωcm. The variation rate (resistivity at 0V/resistivity at 900V) was 24.7%.

In Comparative Example 2, the temperature of the ingot annealing was 410° C., which was higher than that of Examples 1 to 3. The resistivity of the produced CdZnTe monocrystalline substrate when 900 V was applied had a slightly higher variation range than the resistivity when 0 V was applied, with a decrease of about 25%, and the variation range with respect to the applied voltage was beyond a permissible range in terms of the stability of electrical characteristics.

Comparative Example 3

In Comparative Example 3, a CdZnTe monocrystal ingot was grown from a CdZnTe melt having a Zn concentration of 5 at % and a Cl concentration of 100 wtppm. At the end of monocrystal growth, for the temperature inside the furnace, the temperature of the monocrystal placing position was set to 378° C. from the end temperature of the monocrystal growth, and the temperature of the Cd reservoir portion was set to room temperature without opening the quartz ampule in the furnace, and the ingot annealing was carried out for 90 hours. After the ingot annealing, the ingot was cooled to room temperature to produce a CdZnTe monocrystal ingot. Subsequently, a substrate having a square main surface of 4.0 mm×4.0 mm and a thickness of 1.4 mm was cut out from the upper portion of the ingot according to Comparative Example 3 (solidification rate of 0.74). The composition of this substrate was examined, indicating that as shown in Table 1, the Zn ratio was 4.3 at % and the Cl concentration was 3.8 wtppm, which were within the range of the present invention.

Subsequently, from the substrate according to Comparative Example 3, a common electrode was formed from Pt on one main surface (B surface) and pixel electrodes were formed from Pt on the other main surface (A surface) to produce an ohmic type radiation detection element. The IV characteristic curve of the radiation detection element was drawn and calculated, indicating that the resistivity at application of 0 V was $1.6×10^9$ Ωcm, and the resistivity at application of 900 V was $3.6×10^7$ Ωcm. The variation rate (resistivity at 0V/resistivity at 900V) was 43.0%.

In Comparative Example 3, the temperature of the ingot annealing was 378° C., which was lower than that of Examples 1 to 3. The resistivity of the produced CdZnTe monocrystalline substrate when 900 V was applied had a slightly higher variation range than the resistivity when 0 V was applied, with a decrease of about 43.0%, and the variation range with respect to the applied voltage was beyond a permissible range in terms of the stability of electrical characteristics.

When comparing the variation ratios of the resistivities of the substrates of Examples 1 to 3 with those of Comparative Examples 1 to 3, the substrates of Comparative Examples 1 to 3 had a variation ratio of from 24.7 to 3167.9%, whereas those of Examples 1 to 3 had a variation ratio of from 11.6 to 15.0%, which were lower values of 20% or less. This indicates that the substrate produced by the production method according to the present embodiment has a lower ratio (variation ratio) of the resistivity at application of 0 V to the resistivity at application of a voltage of 900 V of 20%, as compared with the substrate produced by the conventional production method.

Further, as a result of studies for the characteristics of the radiation detection elements produced from the substrates according to Examples 1 to 3 and Comparative Examples 1 to 3, it is found that the radiation detection elements according to Examples 1 to 3 have an extremely high 900V resistivity of 2.0 to $5.5×10^7$ Ωcm, and a lower ratio (variation ratio) of the resistivity at application of 0 V to the resistivity at application of a voltage of 900 V of 20% or less, resulting in a stable value of the resistivity with respect to the variations in the applied voltages. Thus, the radiation detection elements according to Examples 1 to 3 have a higher 900 V resistivity and have characteristics suitable for allowing a stable ionizing current to flow at any voltage.

Table 1 shows the production conditions and evaluation results of each Example and each Comparative Example.

TABLE 1

| | Growth Conditions of Monocrystals | | | | | | Substrate Characteristics | |
|---|---|---|---|---|---|---|---|---|
| | | Doped Amount | | Heat Treatment Conditions | | | Dopant Theoretical Value | |
| | Monocrystal | Zn (at %) | Cl (wtppm) | Temp. (° C.) | Time (hr) | Solidification Rate | Zn (at %) | Cl (wtppm) |
| Example 1 | $Cd_{1-x}Zn_xTe$ | 5 | 100 | 385 | 90 | 0.19 | 6.1 | 1.2 |
| Example 2 | $Cd_{1-x}Zn_xTe$ | 5 | 100 | 390 | 90 | 0.75 | 4.3 | 3.9 |
| Example 3 | $Cd_{1-x}Zn_xTe$ | 5 | 200 | 400 | 50 | 0.2 | 6.1 | 2.5 |
| Comparative Example 1 | $Cd_{1-x}Zn_xTe$ | 5 | 100 | 950 | 20 | 0.22 | 6.0 | 1.3 |
| Comparative Example 2 | $Cd_{1-x}Zn_xTe$ | 5 | 100 | 410 | 90 | 0.17 | 6.1 | 1.2 |
| Comparative Example 3 | $Cd_{1-x}Zn_xTe$ | 5 | 100 | 378 | 90 | 0.74 | 4.3 | 3.8 |

TABLE 1-continued

| | Characteristics of Radiation Detection Elements Element Resistivity (Ωcm) | | | | | | Variation Ratio: 0 V/900 V |
| --- | --- | --- | --- | --- | --- | --- | --- |
| | 0 V | 100 V | 250 V | 500 V | 700 V | 900 V | (%) |
| Example 1 | 2.9E+08 | 1.4E+08 | 8.7E+07 | 4.3E+07 | 2.9E+07 | 2.0E+07 | 14.8 |
| Example 2 | 6.4E+08 | 4.9E+08 | 3.1E+08 | 1.5E+08 | 8.9E+07 | 5.5E+07 | 11.6 |
| Example 3 | 5.8E+08 | 4.0E+08 | 2.4E+08 | 1.0E+08 | 6.2E+07 | 3.9E+07 | 15.0 |
| Comparative Example 1 | 1.1E+09 | 1.1E+08 | 1.9E+07 | 1.6E+06 | 2.6E+07 | 3.5E+05 | 3167.9 |
| Comparative Example 2 | 5.7E+08 | 3.0E+08 | 1.5E+08 | 6.4E+07 | 3.8E+07 | 2.3E+07 | 24.7 |
| Comparative Example 3 | 1.6E+09 | 5.8E+08 | 2.4E+08 | 9.3E+07 | 5.6E+07 | 3.6E+07 | 43.0 |

As described above, when the raw materials are filled in the crucible, an amount of a part of the raw materials (Zn and Cl) is adjusted such that the concentrations in the monocrystal are within a predetermined range (zinc concentration is 4.0 at % or more and 6.5 at % or more, and the chlorine concentration is 0.1 ppm by mass or more and 5.0 ppm by mass or less) to grow the CdZnTe monocrystal, and after the crystal growth step of the single crystal is completed, the heat treatment is carried out for 50 to 90 hours under the conditions where the temperature of the monocrystal placing position in the furnace is 385 to 400° C., and the temperature of the Cd reservoir portion is room temperature without opening the ampule in the furnace, whereby the CdZnTe wafer can be obtained which has the higher resistivity at application of a voltage of 900 V of $1.0 \times 10^7$ Ωcm or more and $1.0 \times 10^8$ Ωcm or less, and the lower ratio (variation ratio) of the resistivity at application of 0 V to the resistivity at application of a voltage of 900 V of 20% or less, and has the stable resistivity value with respect to variations in the applied voltage. Therefore, the use of the radiation detection element 2 provided with the substrate 21 cut out from the CdZnTe wafer can allow a stable resistivity to be maintained for each voltage application value even if a higher bias voltage is applied, thereby suppressing generation of a large amount of leakage current.

Therefore, the radiation detection performance can be improved in the radiation detector 1 provided with the radiation detection element 2 using the CdZnTe monocrystal as a substrate.

While the invention made by the present inventors has been specifically described above based on the embodiments, the present invention is not limited to the above embodiments and may be modified without departing from the spirit of the present invention.

For example, in the present embodiment, the shape of the main surface of the substrate 21 is square, but it may be rectangular or other shapes, and the number and arrangement of the pixel electrodes 23 may be determined depending on the size and shape of the main surface 21a.

Further, in the present embodiment, each of the main surfaces 21a, 21b of the substrate is the (111) plane, but other crystal planes may be used.

Further, in the present embodiment, each of the common electrode 22 and the pixel electrode 23 is formed from Pt, but it may be made of gold (Au) or other metals, or an alloy containing these metals. Furthermore, one of the common electrode 22 and the pixel electrode 23 may be formed from a metal different from the other (for example, the common electrode 22 is formed from indium (In) and the pixel electrode 23 is formed from Pt).

Moreover, the circuit provided between the radiation detection element 2 and the data generation unit 6 may have any configuration as long as a predetermined electric signal can be obtained.

DESCRIPTION OF REFERENCE NUMERALS 1 radiation detector
2 radiation detection element
21 substrate (semiconductor wafer, compound semiconductor monocrystal)
21a, 21b main surface
22 common electrode
23 pixel electrode
4 amplification unit
5 power supply
6 data generation unit
9 monocrystal growth furnace
91 cadmium filling portion
92 heater
92a upper heater
92b lower heater
93 quartz ampoule
93a quartz ampoule portion of crucible storage portion
93b Cd reservoir portion

The invention claimed is:

1. A semiconductor wafer comprising a cadmium zinc telluride monocrystal having a zinc concentration of 4.0 at % or more and 6.5 at % or less and a chlorine concentration of 0.1 ppm by mass or more and 5.0 ppm by mass or less, wherein the semiconductor wafer has a resistivity of $1.0 \times 10^7$ Ωcm or more and $1.0 \times 10^8$ Ωcm or less when a voltage of 900 V is applied, and wherein a ratio (variation ratio) of the resistivity at application of 0 V to the resistivity at application of a voltage of 900 V is 20% or less.

2. A radiation detection element, comprising:
a substrate cut out from the semiconductor wafer according to claim 1 such that a main surface is rectangular;
a common electrode formed on one main surface of the substrate; and
a plurality of pixel electrodes formed in matrix on the other main surface of the substrate.

3. The radiation detection element according to claim 2, wherein the radiation detection element has a resistivity of $1.0 \times 10^7$ Ωcm or more and $1.0 \times 10^8$ Ωcm or less when a voltage of 900 V is applied, and wherein a ratio (variation ratio) of the resistivity at application of 0 V to the resistivity at application of a voltage of 900 V is 20% or less.

4. A radiation detector, comprising:
the radiation detection element according to claim 2;
a power source for applying a bias voltage to the radiation detection element, the power source being connected to the radiation detection element; and
an amplification unit for amplifying an electric signal output from the radiation detection element, the amplification unit being connected to the radiation detection element.

5. A method for producing a compound semiconductor monocrystalline substrate, the substrate comprising a cadmium zinc telluride monocrystal having a zinc concentration of 4.0 at % or more and 6.5 at % or less and a chlorine concentration of 0.1 ppm by mass or more and 5.0 ppm by mass or less, the substrate having a resistivity of $1.0 \times 10^7$ $\Omega$cm or more and $1.0 \times 10^8$ $\Omega$cm or less when a voltage of 900 V is applied,
wherein the method comprises:
a crystal growth step of a monocrystal in a furnace; and
after the crystal growth step of the monocrystal is completed, a step of subjecting the monocrystal to a heat treatment for 50 to 90 hours under conditions where a temperature of a monocrystal placing position in the furnace is 385 to 400° C. and a temperature of a Cd reservoir portion is room temperature without opening an ampule in the furnace, and slicing a heated monocrystal ingot into a wafer to form a substrate.

\* \* \* \* \*